(12) United States Patent
Yamashita (10) Patent No.: US 9,466,252 B2
(45) Date of Patent: Oct. 11, 2016

(54) PARTIAL SCANNING GATE DRIVER AND LIQUID CRYSTAL DISPLAY USING THE SAME

(71) Applicant: InnoLux Corporation, Miao-Li County (TW)

(72) Inventor: Keitaro Yamashita, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 353 days.

(21) Appl. No.: 14/022,544

(22) Filed: Sep. 10, 2013

(65) Prior Publication Data
US 2015/0070259 A1 Mar. 12, 2015

(51) Int. Cl.
*G09G 3/36* (2006.01)
*G11C 19/28* (2006.01)

(52) U.S. Cl.
CPC .......... *G09G 3/3648* (2013.01); *G09G 3/3688* (2013.01); *G11C 19/28* (2013.01); *G09G 2310/0213* (2013.01); *G09G 2310/0286* (2013.01); *G09G 2320/103* (2013.01); *G09G 2330/023* (2013.01)

(58) Field of Classification Search
CPC .................. G09G 2310/0286; G09G 2310/08; G09G 3/3677; G09G 3/3648; G09G 3/3266
See application file for complete search history.

(56) References Cited

U.S. PATENT DOCUMENTS

2010/0053138 A1* 3/2010 Im ........................ G09G 3/3614
345/211
2013/0293529 A1* 11/2013 You .......................... G09G 3/20
345/212

FOREIGN PATENT DOCUMENTS

CN 103137081 6/2013

OTHER PUBLICATIONS

Chinese language office action dated Apr. 6, 2016, issued in application No. CN 201410427312.0.

* cited by examiner

*Primary Examiner* — Jose Soto Lopez
(74) *Attorney, Agent, or Firm* — McClure, Qualey & Rodack, LLP (57) ABSTRACT

An embodiment of the invention provides a liquid crystal display (LCD) device including a pixel array, a timing controller to output a clock signal and a gate driver. The gate driver receives the clock signal to control rows of the pixel array to be turned on or turned off. The gate driver includes a first shift register coupled to a first row of the pixel array, and a second shift register coupled to a second row of the pixel array. When the first row is determined to be skipped, the first shift register outputs a first voltage level to the first row, and when the second row is to be scanned, the second shift register outputs a second voltage level, wherein the first voltage level is between the second voltage level and a third voltage level which maintains a previously written display data.

15 Claims, 12 Drawing Sheets

PARTIAL SCANNING GATE DRIVER AND LIQUID CRYSTAL DISPLAY USING THE SAME

BACKGROUND OF THE INVENTION

1. Field of the Invention

The present invention relates to a liquid crystal display and more particularly to a gate driving method of the liquid crystal display.

2. Description of the Related Art

Liquid crystal displays (LCD) have become the major product of displays, and minimizing the size and the weight of the LCDs, to dispose the driving circuit on the substrate of the LCD has become a major technological focus. A liquid crystal display (LCD) typically includes rows and columns of picture elements (or pixels) arranged in a matrix form. Each pixel includes a thin film transistor (TFT) and a pixel electrode formed on a substrate (or panel). The gates of the TFTs in the same row are connected together through a gate line, and controlled by a gate driver (or scan driver). The sources of the TFTs in the same column are connected together through a source line, and controlled by a source driver (or data driver).

Aiming for the obtainment of a narrower layout width, dynamic gates have been realized in displays with the amorphous Si and low temperature poly silicon (LTSP) process. Take the TFT LCD for example, the low electron mobility of amorphous Si limits the size of an element formed by the amorphous Si process, such as a thin film transistor (TFT). If a larger current is desired for the transistor formed by the amorphous Si process, the width of the channel of the transistor is increased, thus, the layout area increases.

BRIEF SUMMARY OF THE INVENTION

An embodiment of the invention provides a liquid crystal display (LCD) device. The LCD device includes a pixel array, a timing controller for outputting a clock signal and a gate driver. The pixel array includes a plurality of pixels arranged in rows and columns. The gate driver receives the clock signal to control the rows of the pixel array to be turned on or turned off. The gate driver includes a first shift register coupled to a first row of the pixel array, and a second shift register coupled to a second row of the pixel array. When it is determined that the first row is to be skipped, the first shift register outputs a first voltage level to the first row with the clock signal, and when it is determined that the second row is to be scanned, the second shift register outputs a second voltage level to the second row with the clock signal, wherein the first voltage level is between the second voltage level and a third voltage level which maintains a previously written display data of the pixel array.

Another embodiment of the invention provides a liquid crystal display (LCD) device. The LCD device comprises a pixel array and a determination module. The pixel array comprises a plurality of pixels arranged in rows and columns, wherein at least one of the pixels comprises a pixel electrode and a common electrode. The determination module receiving and comparing a first frame with a second frame to determine whether a first row of the pixel array needs to be scanned or skipped. When it is determined that the first row is to be skipped, a voltage level of the common electrode is maintained, and when it is determined that the first row is to be scanned, the voltage level of the common electrode is pulled low until the pixels coupled to the first row is turned on.

Another embodiment of the invention provides a gate driving method for a gate driver having a plurality of the shift registers. The method comprises the steps of receiving a first frame and a second frame, determining whether a first row of a pixel array needs to be scanned or skipped, when it is determined that the first row is to be skipped, generating a first clock signal with a first voltage level and transmitting the first clock signal to a first shift register corresponding to the first row, and when it is determined that the first row is to be scanned, generating a second clock signal with a second voltage level and transmitting the second clock signal to the first shift register, wherein the first voltage level is between the second voltage level and a third voltage level which maintains a previously written display data of the pixel array.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
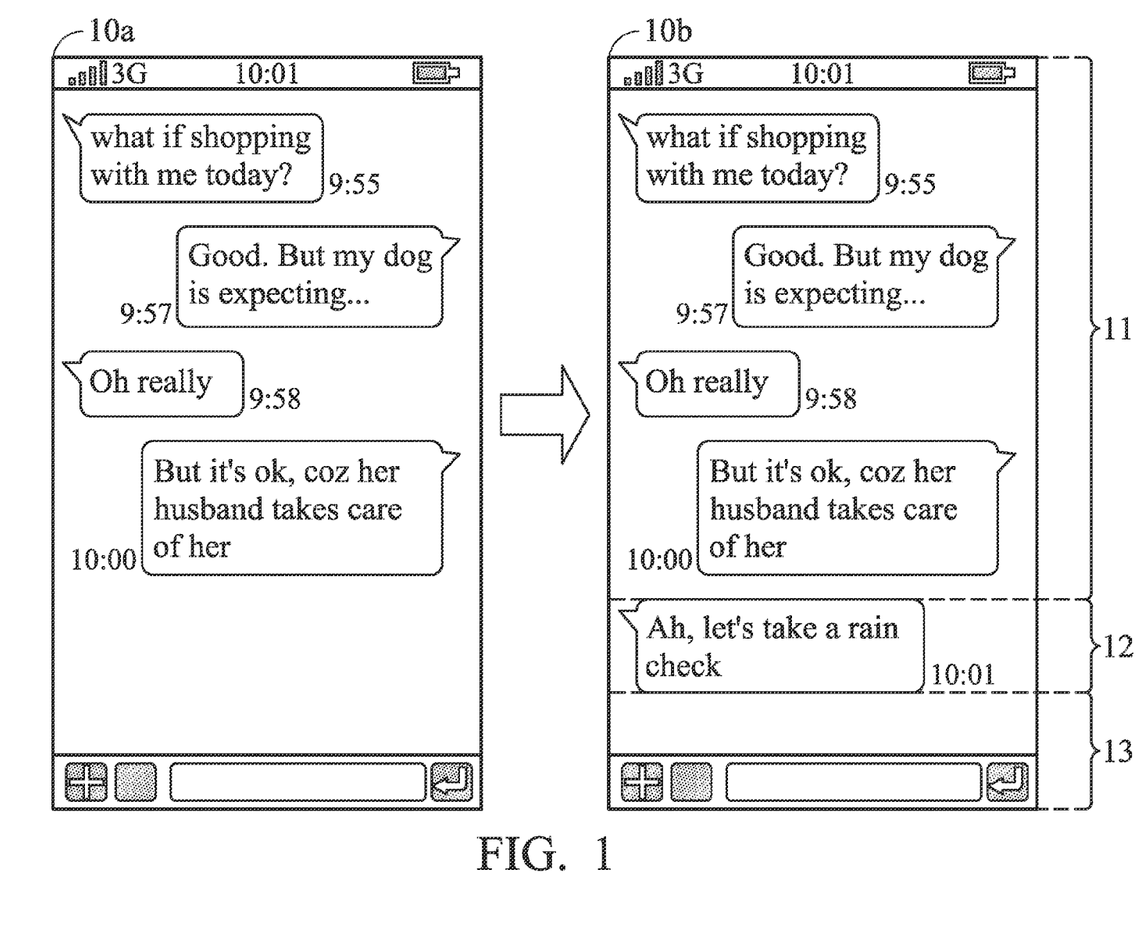
FIG. 1 shows a schematic diagram of the changing of a chatting screen at two successive time points.

FIG. 1 shows a schematic diagram of the changing of a chatting screen at two successive time points. When the chatting screen is changed from the screen 10a to 10b, it can be found that only the image displayed in area 12 changes. As to the images displayed in areas 11 and 13, they do not change. Thus, to reduce the power consumption and increase the efficiency of the LCD driving scheme, only the rows in the area 12 need to be scanned.

Figure 2:
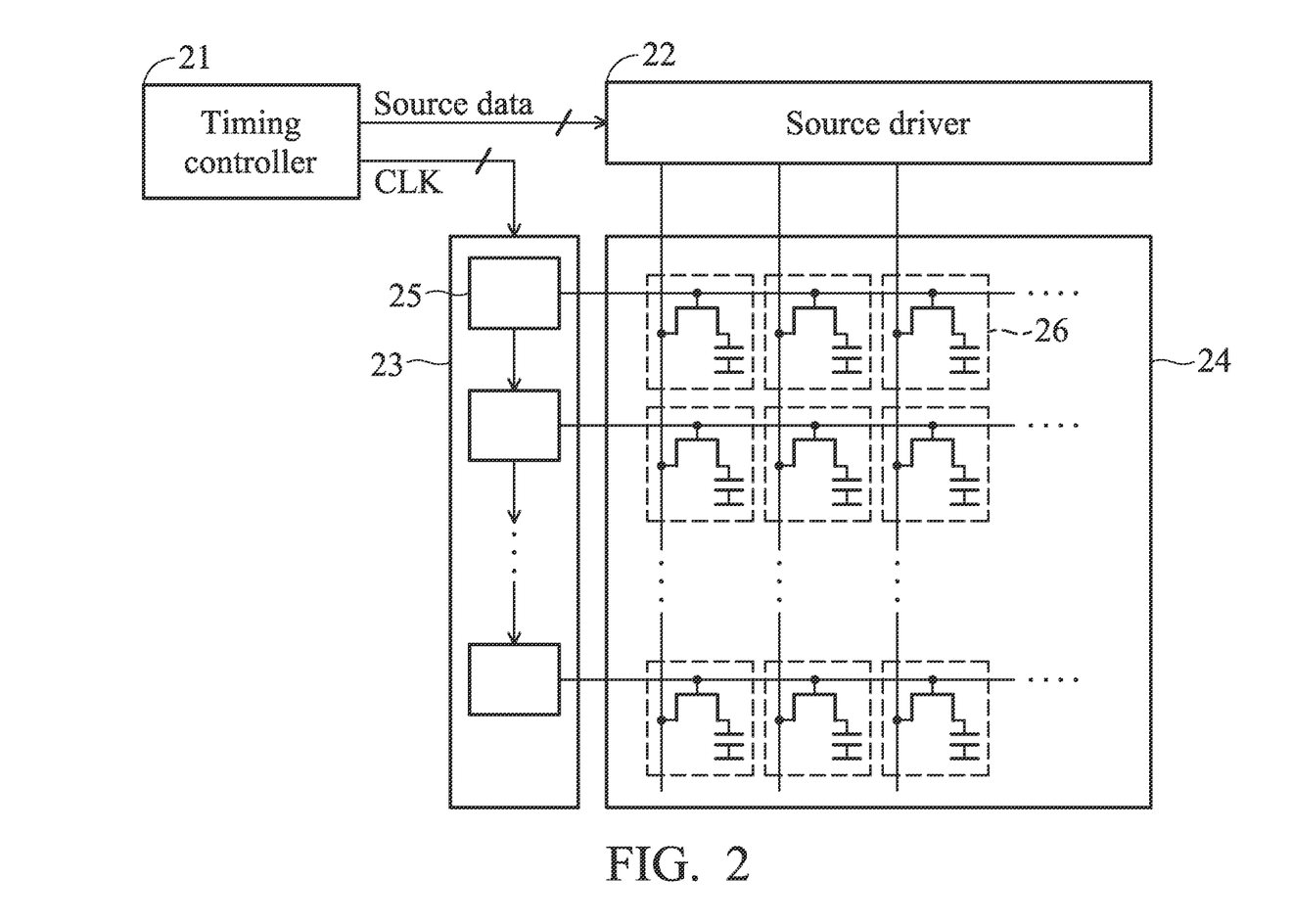
FIG. 2 shows a schematic diagram of an LCD.

FIG. 2 shows a schematic diagram of an LCD. The LCD comprises a timing controller 21, a source driver 22, a gate driver 23 having a plurality of the shift registers 25, and a panel 24 comprising a plurality pixel 26 arranged in a matrix form, which is also called as a pixel array. The timing controller 21 outputs a source data to the source driver 22 and a clock signal CLK to the gate driver 23. The timing controller 21 synchronizes the source data and the clock signal to ensure that display data is displayed in a correct pixel at correct timing.

The shift register comprises a switch, such as an NMOS transistor or a PMOS transistor, to determine whether a row corresponding the shift register is to be turned on or not. The output signal of the shift register is also transmitted to a next stage of the shift register to enable the operation of the next stage of the shift register. When the shift register is enabled, the shift register transfers the received clock signal to turn on or turn off a row of the pixel array.

Figure 3:
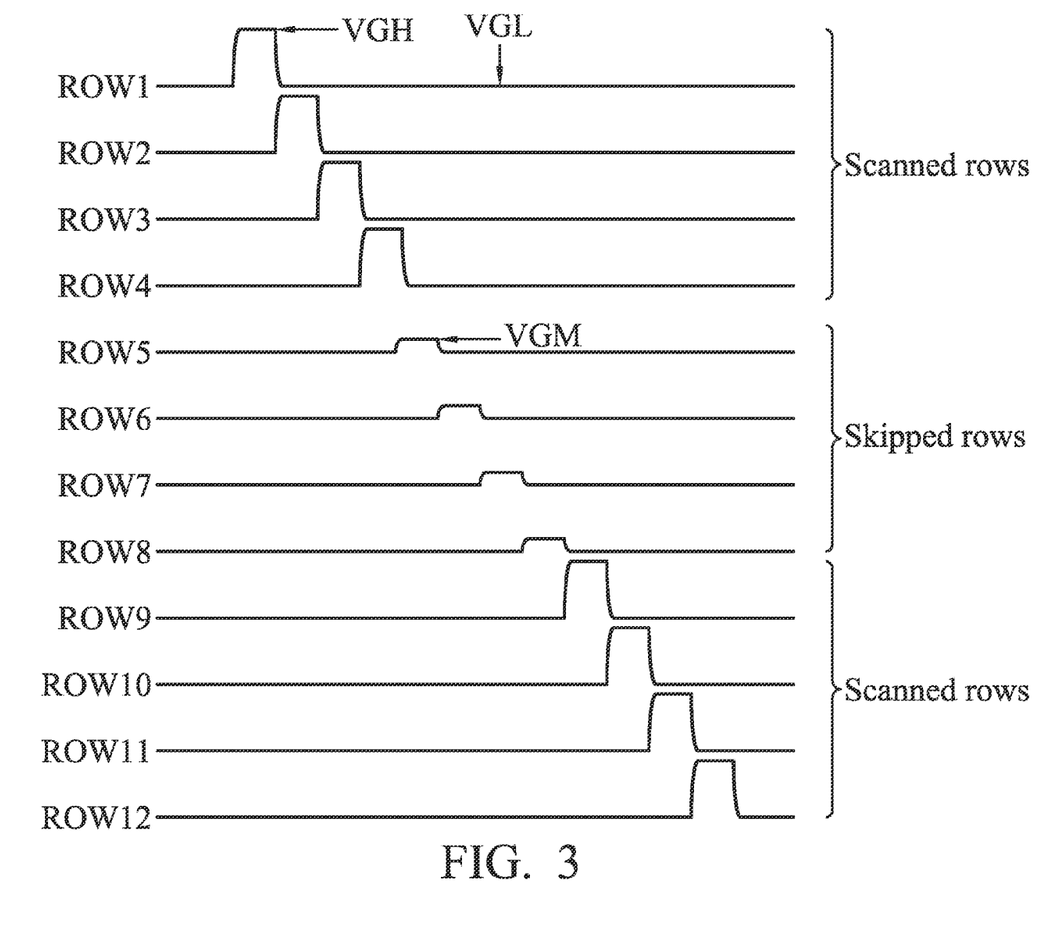
FIG. 3 shows a waveform of a gate driving timing for a pixel array.

For the detailed description of the gate driving of the LCD, please refer to FIG. 3. FIG. 3 shows a waveform of a gate driving timing for a pixel array. The pixel array comprises 12 rows of pixel. In FIG. 3, only the rows 1 to 4 and 9 to 12 need to be scanned. In FIG. 3, pulses consist of three voltage levels. Among the predetermined high voltage level (VGH), middle voltage (VGM) and low voltage (VGL), the VGH is set to turn on the pixel TFT to write display data to the pixel electrode, the VGL is set to maintain the off state of the pixel TFT to maintain the previously written display data of the pixel electrode in a period before and after above scan and skip period, and the VGM is set to not turn on the pixel TFT but have enough of a high voltage to maintain the propagation of the shift register operation of the gate driver. Since the operation of the shift register needs an output signal of a previous shift register or a start signal STV, the voltage level VGL cannot be applied to the skipped rows because the shift register operation may be interrupted. Take FIG. 3 for example, if the voltage level of row 5 is the VGL, the shift registers corresponding to the rows 6 to 12 may not be driven, and a display error may be caused.

The VGL and VGM are predetermined by following equations:

$$VGM < Vsn + Vth$$

$$VGL < VGM - Vgswing$$

where Vsn and Vsp are minimum and maximum source voltage levels, respectively, Vth is the TFT threshold voltage, and Vgswing is for a minimum pulse height to maintain the shift register function.

The three predetermined voltage levels are provided by the clock signal. Simply speaking, one aspect of the innovation uses a clock signal with three voltage levels to implement partial scanning.

Figure 4:
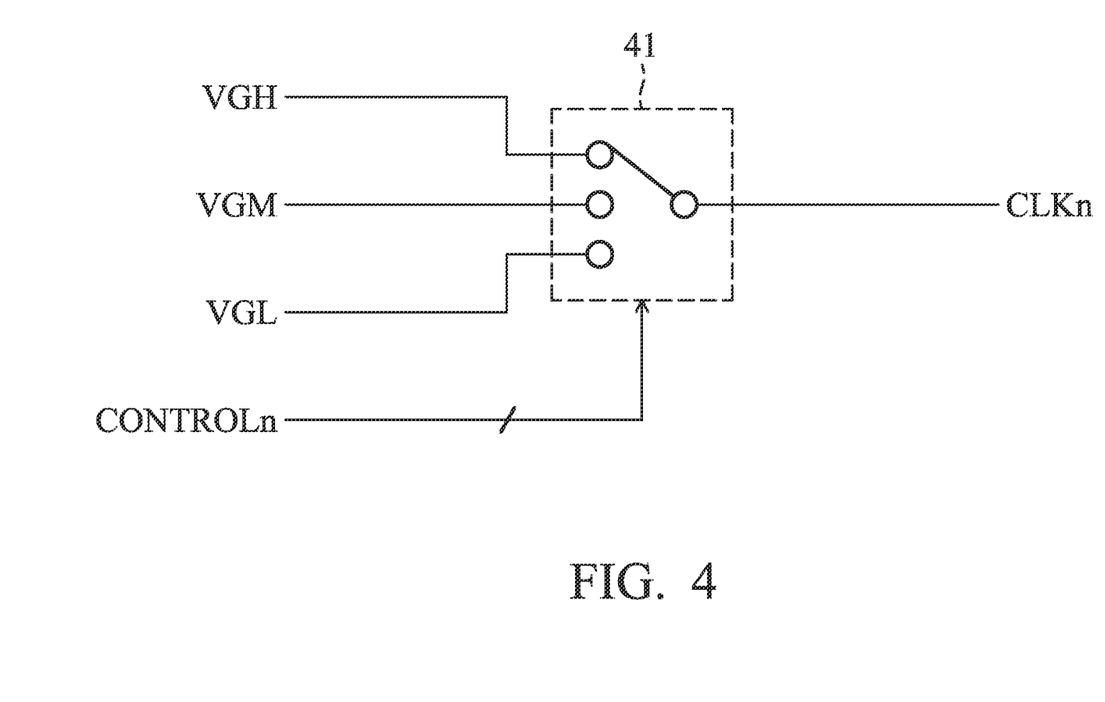
FIG. 4 is a schematic diagram of a clock voltage level selector in a timing controller according to an embodiment of the invention.

Please refer to FIG. 4. FIG. 4 is a schematic diagram of a clock voltage level selector in a timing controller according to an embodiment of the invention. The multiplexer 41 is controlled by the control signal CONTROLn and determines the voltage level of the clock signal CLKn according to the control signal CONTROLn. Assuming the rows 1~4 are the skipped rows, the voltage levels of the corresponding clock signal $CLK_1$~$CLK_4$ are VGM. Assuming the rows 5~12 have to be scanned, the voltage levels of the corresponding clock signal $CLK_5$~$CLK_{12}$ are VGH.

Figure 5:
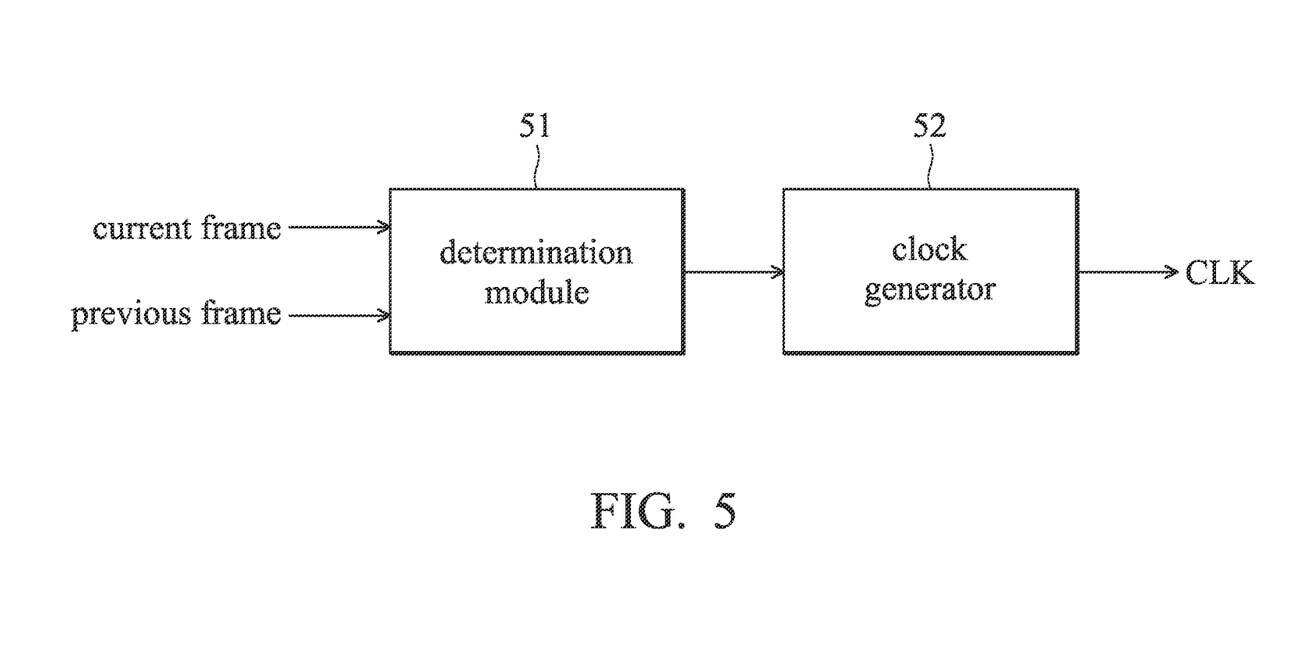
FIG. 5 is a schematic diagram of a timing controller according to an embodiment of the invention.

FIG. 5 is a schematic diagram of a timing controller according to an embodiment of the invention. The timing controller comprises a determination module 51 and a clock generator 52. The determination module 51 receives and compares a current frame and a previous frame to determine which row needs to be scanned or skipped. The current frame and the previous frame comprise a plurality of rows of pixel data and the determination module 51 compares the current frame and the previous frame row by row. If the row of pixel data does not change between the current frame and the previous frame, the row is labeled as a skipped row and the clock generator 52 generates the clock signal with the voltage level VGM. If the row of pixel data changes between the current frame and the previous frame, the row is labeled as a scanned row and the clock generator 52 generates the clock signal with the voltage level VGH.

Figure 6:
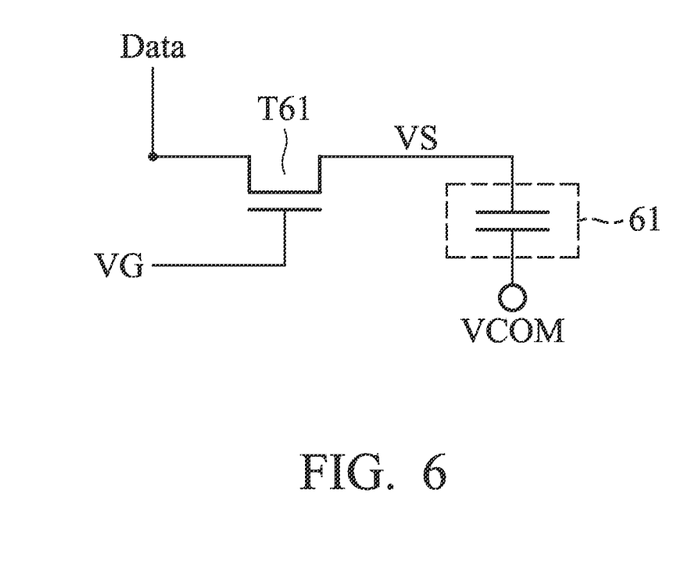
FIG. 6 shows a schematic diagram of a pixel.

FIG. 6 shows a schematic diagram of a pixel. The pixel 61 is coupled between a source voltage VS of the transistor T61 and a voltage VCOM. The pixel 61 is formed between a common electrode and a pixel electrode, and the voltage difference between the pixel electrode and the common electrode determines the display of the pixels. The voltage VCOM is the voltage level of the common electrode.

Moreover, to prevent the LC layer from deteriorating due to the long-term application of the one-directional electric field, an inversion driving scheme may be applied by pulling up and down the common electrode voltage (VCOM) to periodically reverse the applied electric field.

When the voltage $V_{GS}$ of the transistor T61 is larger than a threshold voltage, the transistor T61 is turned on. In one embodiment, the transistor T61 is turned on or not according to the voltage level VG. In another embodiment, the transistor T61 can be turned on by adjusting the voltage level of the VCOM.

Figure 7:
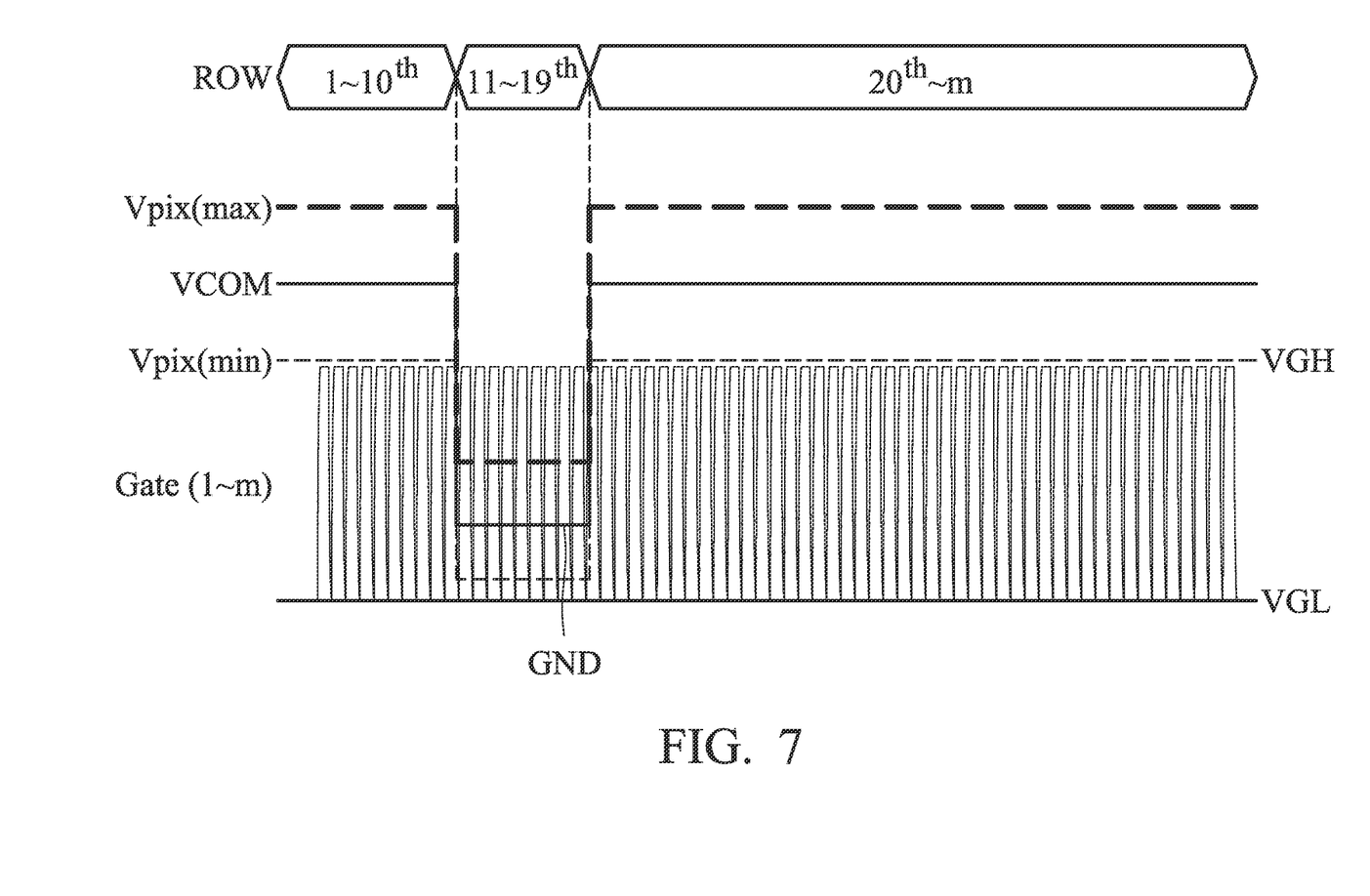
FIG. 7 is a schematic diagram of a gate driving scheme by modulating the voltage VCOM according to an embodiment of the invention.

FIG. 7 is a schematic diagram of a gate driving scheme by modulating the voltage VCOM according to an embodiment of the invention. In FIG. 7, only rows 11 to 19 need to be scanned. When driving the rows 11 to 19, the voltage VCOM is pulled low until the pixel TFT, such as the transistor T61, is turned on. In FIG. 7, when the voltage VCOM is higher than the voltage VGH, the pixel TFT is maintained off. Thus, in the VCOM driving mechanism, whenever skipping or scanning is needed, the VCOM voltage only needs to be set to be higher than the voltage by half of the maximum source dynamic range of the VGH. In FIG. 7, the maximum source dynamic range is determined based on the voltages Vpix(max) and Vpix(min). In one embodiment, the voltage VCOM is control by a control signal which is the same as the control signal of the determination module 51 in FIG. 5.

Figure 8:
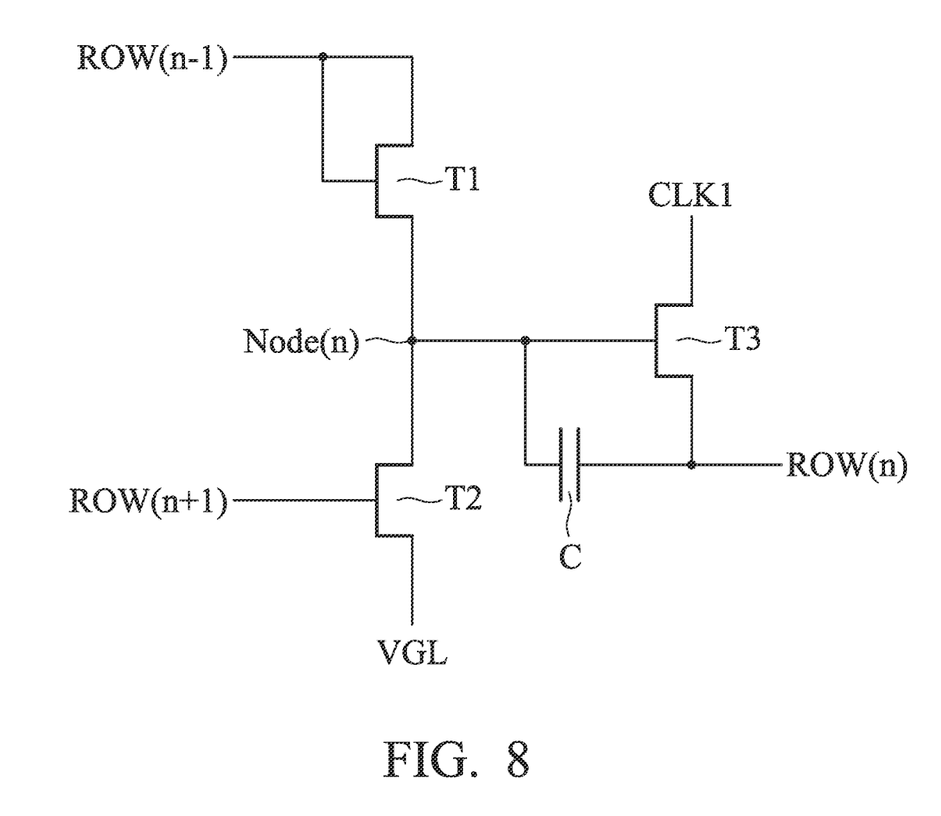
FIG. 8 is a circuit diagram of a shift register according to an embodiment of the invention.

FIG. 8 is a circuit diagram of a shift register according to an embodiment of the invention. The gate and the drain of the transistor T1 is connected to an output ROW(n−1) of a previous stage of the shift register. The Node(n) is connected to the source of the transistor T1, the gate of transistor T3 and the drain of the transistor T2. The drain of transistor T3 receives a clock signal CLK1 and the source of the transistor T3 is connected to an output ROW(n) of the shift register, wherein a parasitic capacitor is coupled between the gate and the source of the transistor T3. The gate of the transistor T2 is coupled to an output ROW(n+1) of a next stage of the shift register and the source of the transistor T2 is coupled to voltage VGL.

When the previous stage of the shift register outputs a high voltage level signal, the transistor T1 is then turned on. Then, the voltage level of the Node(n) is also pulled up to the high voltage level and the transistor T3 is also turned on. Then the clock signal CLK1 is directed to the output ROW(n) of the shift register. When the output of next stage of the shift register is pulled high, the transistor is turned on and the transistor T3 is then turned off.

Figure 9:
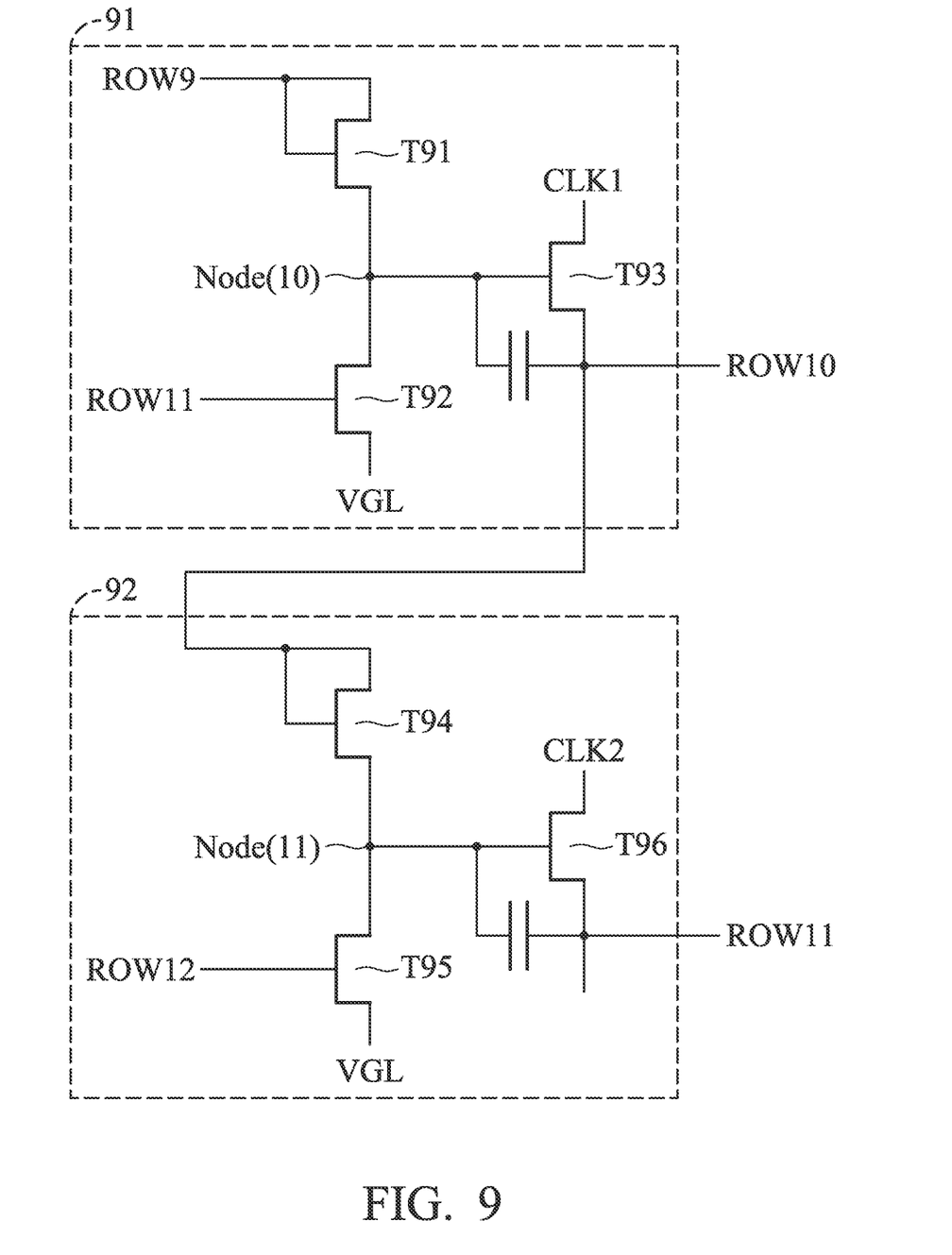
FIG. 9 is a circuit diagram of two shift registers according to an embodiment of the invention.
Figure 10:
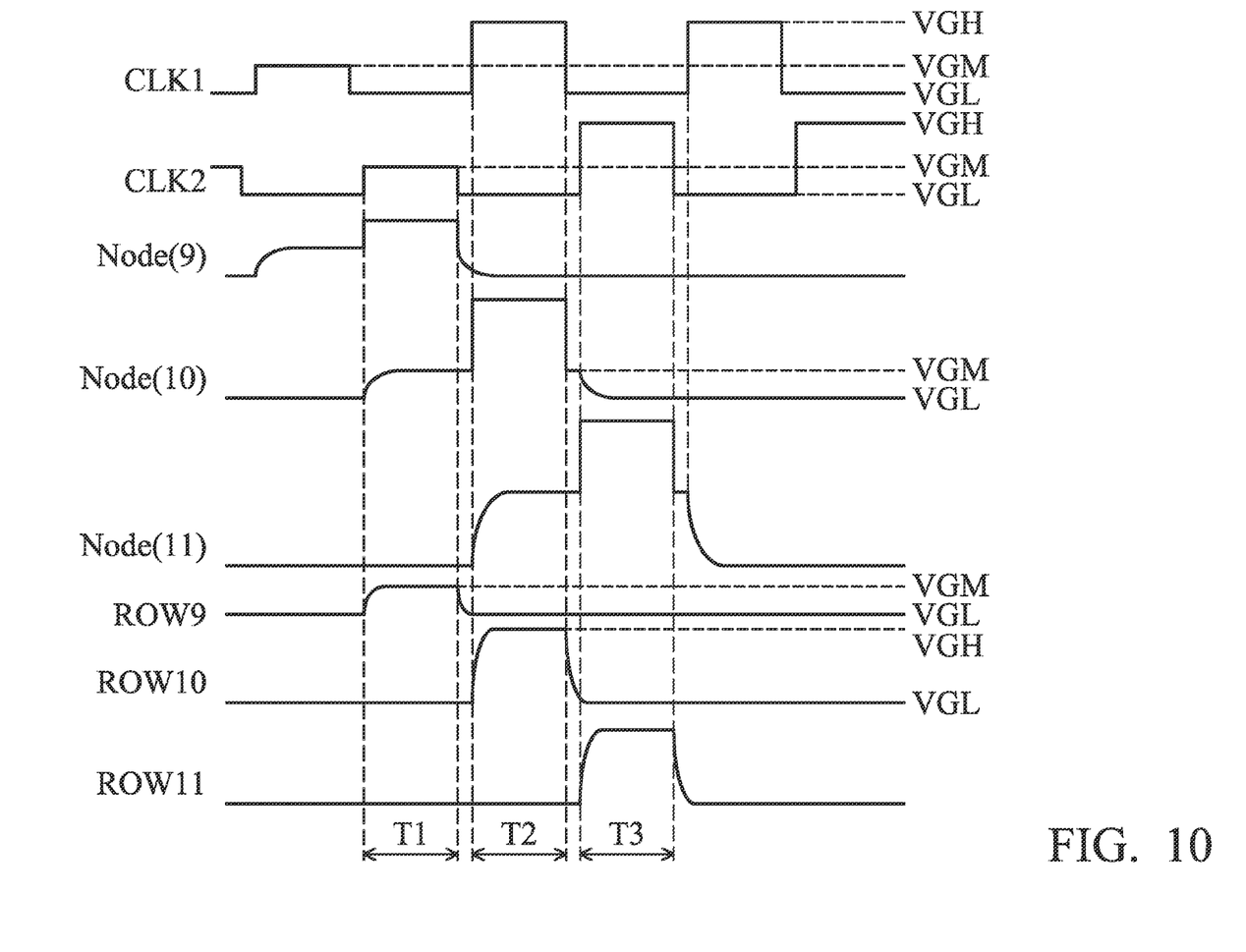
FIG. 10 is a waveform of the shift register in FIG. 9.

For more detailed operation of the shift register, reference can be made to the FIGS. 9 and 10. FIG. 9 is a circuit diagram of two shift registers according to an embodiment of the invention. The shift register 91 determines whether the pixel TFTs connected to the row 10 are to be turned on or maintained in off states. The shift register 92 determines whether the pixel TFTs connected to the row 11 is to be turned on or maintained in an off state. The gate and the drain of the transistor T91 is connected to an output ROW 9 of a previous stage of the shift register. The Node(10) is connected to the source of the transistor T91, the gate of transistor T93 and the drain of the transistor T92. The drain of the transistor T93 receives a clock signal CLK1 and the source of the transistor T93 is connected to an output ROW 10 of the shift register, wherein a parasitic capacitor is coupled between the gate and the source of the transistor T93. The gate of the transistor T92 is coupled to an output ROW 11 of a next stage of the shift register and the source of the transistor T92 is coupled to voltage VGL.

The gate and the drain of the transistor T94 is connected to an output ROW 10 of the shift register 91. The Node(11) is connected to the source of the transistor T94, the gate of transistor T96 and the drain of the transistor T95. The drain of transistor T96 receives a clock signal CLK2 and the source of the transistor T96 is connected to an output ROW 11 of the shift register, wherein a parasitic capacitor is coupled between the gate and the source of the transistor T96. The gate of the transistor T95 is coupled to an output ROW 12 of a next stage of the shift register and the source of the transistor T95 is coupled to voltage VGL. As to the detailed operation of the circuit shown in FIG. 9, please refer to FIG. 10.

FIG. 10 is a waveform of the shift register in FIG. 9. During the time period T1, the gate of the transistor T91 receives the voltage VGM from the ROW 9 and the transistor T91 is therefore turned on. At the same time, the voltage level of the node (10) is also increased to the VGM and the transistor T93 is therefore turned on. During the time period T2, the voltage level of ROW 10 is increased to the VGH that is the same as the voltage level of the clock signal CLK1. At the same time, the transistor T94 is also turned on and the voltage level of the node (11) is increased to the voltage level VGH. During the time period T3, the transistors T92 and T96 are turned on. The voltage level of the node (10) is therefore pulled low to the voltage level VGL. The voltage level of ROW 11 is increased to the VGH that is the same as the voltage level of the clock signal CLK2. As to the node (11), the voltage level of the node (11) is pulled up again during the time period T3 until the transistor T95 is turned on. When this occurs, the voltage level of the node (11) is then pulled low to the voltage level VGL.

Figure 11:
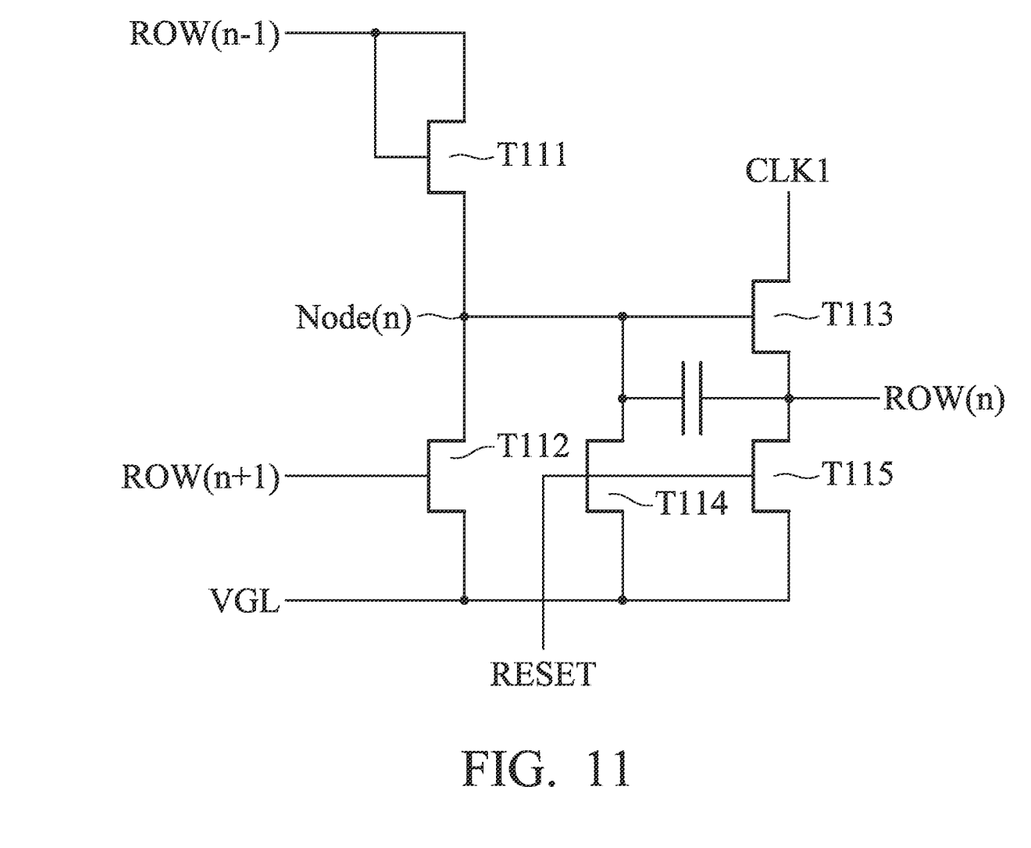
FIG. 11 is a circuit diagram of a shift register according to another embodiment of the invention.

FIG. 11 is a circuit diagram of a shift register according to another embodiment of the invention. The gate and the drain of the transistor T111 is connected to an output ROW(n-1) of a previous stage of the shift register. The Node(n) is connected to the source of the transistor T111, the gate of transistor T113 and the drains of the transistors T112 and T114. The drain of transistor T113 receives a clock signal CLK1 and the source of the transistor T113 is connected to an output ROW(n) of the shift register, wherein a parasitic capacitor is coupled between the gate and the source of the transistor T113. The gate of the transistor T112 is coupled to an output ROW(n+1) of a next stage of the shift register and the source of the transistor T112 is coupled to voltage VGL. The gates of the transistors T114 and T115 can receive a RESET signal and the sources of the both transistors are coupled to voltage VGL to quickly pull the voltage level of ROW(n) to the VGL.

Figure 12:
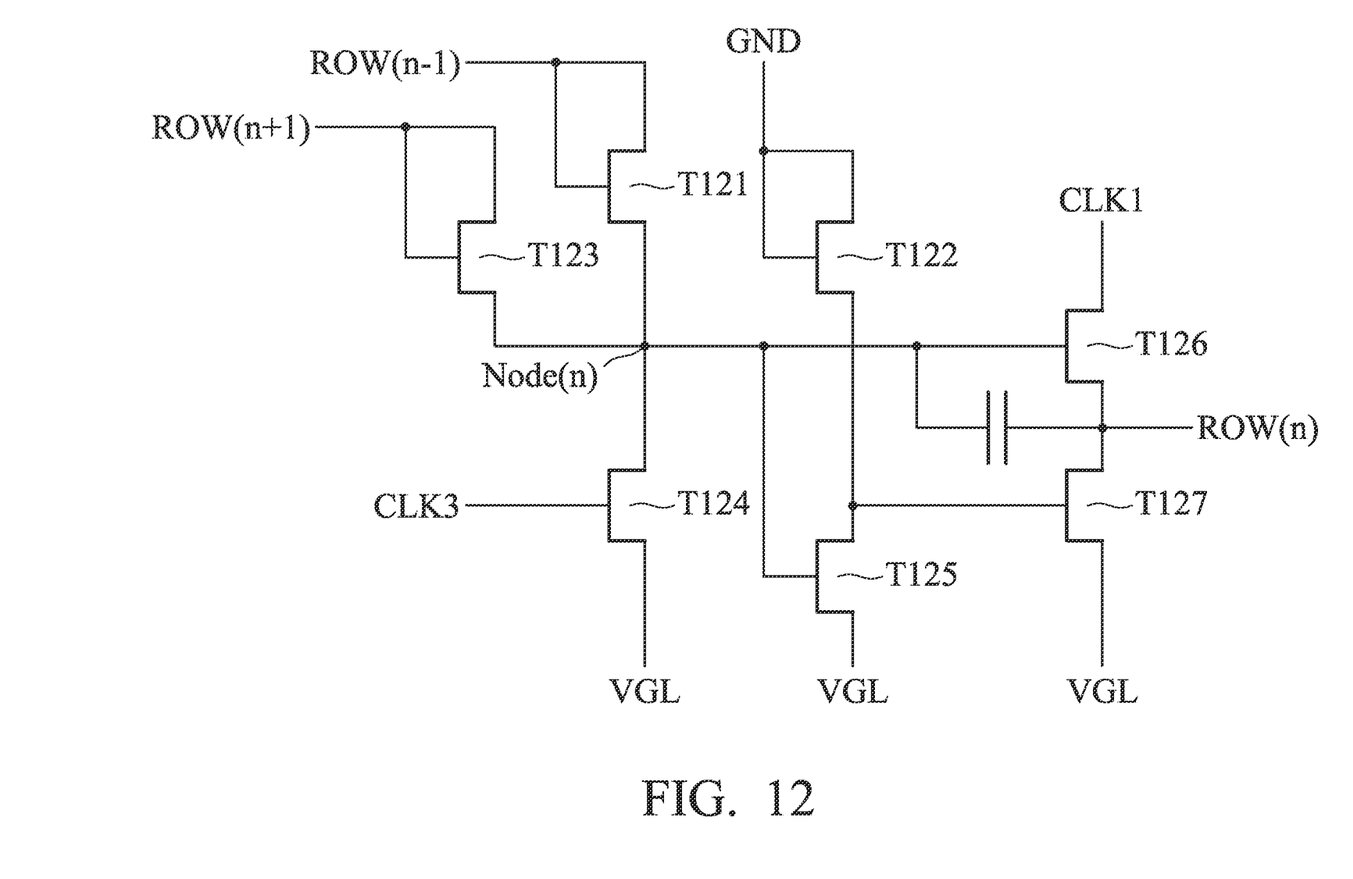
FIG. 12 is a circuit diagram of a shift register with a reverse scan function according to another embodiment of the invention.

FIG. 12 is a circuit diagram of a shift register with a reverse scan function according to another embodiment of the invention. The gate and the drain of the transistor T121 is connected to an output ROW(n-1) of a previous stage of the shift register. The gate and the drain of the transistor T123 is connected to an output ROW(n+1) of a next stage of the shift register. The gate and the drain of the transistor T122 are grounded. The Node(n) is connected to the sources of the transistor T121 and T123, the gates of transistors T126 and T125, and the drain of the transistor T124. The gate of the transistor T124 receives a clock signal CLK3. The drain of transistor T126 receives a clock signal CLK1 and the source of the transistor T1126 is connected to an output ROW(n) of the shift register, wherein a parasitic capacitor is coupled between the gate and the source of the transistor T126. The drains of transistors T124, T125 and T127 are coupled to voltage VGL. The source of transistor T122 is connected to the drain of transistor T125 and the gate of transistor T127.

During a forward scan, the voltage level of the node (n) is determined based on the voltage level of ROW(n-1). When the forward scan is executed on a last row, an inverse scan operation is then applied. Thus, the voltage level of the node (n) is determined based on the voltage level of ROW (n+1). The operation of the forward scan and the inverse scan are similar to the operation of the shift register described above, and not discussed here for brevity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A liquid crystal display device, comprising:
   a pixel array comprising a plurality of pixels arranged in rows and columns;
   a timing controller outputting a clock signal;
   a gate driver receiving the clock signal, comprising:
     a first shift register coupled to a first row of the pixel array; and
     a second shift register coupled to a second row of the pixel array, wherein when it is determined that the first row is to be skipped, the first shift register outputs a first voltage level to the first row with the clock signal, and when it is determined that the second row is to be scanned, the second shift register outputs a second voltage level to the second row with the clock signal, wherein the first voltage level is between the second voltage level and a third voltage level which maintains a previously written display data of the pixel array;
   wherein at least one of the pixels comprises a pixel transistor, and the first voltage level is set to not turn on the pixel transistor but have enough of a high voltage to maintain the propagation of the first shift register operation of the gate driver.

2. The liquid crystal display device as claimed in claim 1, wherein the timing controller receives a control signal to adjust the voltage level of the clock signal.

3. The liquid crystal display device as claimed in claim 2, wherein the control signal is determined based on a previous frame and a current frame or the current frame and a next frame.

4. The liquid crystal display device as claimed in claim 1, wherein the timing controller comprises a determination module to receive and compare a current frame and a previous frame to determine which row needs to be scanned or skipped.

5. The liquid crystal display device as claimed in claim 4, wherein the determination module compares the current frame and the previous frame row by row.

6. The liquid crystal display device as claimed in claim 1, wherein the timing controller further comprises a clock generator to generate the first voltage level to the first row with the clock signal when it is determined that the first row is to be skipped.

7. The liquid crystal display device as claimed in claim 1, wherein the pixel transistor can be turned on by the second voltage level.

8. The liquid crystal display device as claimed in claim 1, wherein the first shift register comprises a first transistor comprising a first drain coupled to an output of a previous shift register, a first gate coupled to the previous shift register, and a first source.

9. The liquid crystal display device as claimed in claim 8, wherein the first shift register further comprises a second transistor comprising a second drain coupled to the first source of the first transistor, a second gate coupled to an output of a next shift register and a second source coupled to the third voltage level.

10. The liquid crystal display device as claimed in claim 9, wherein the first shift register further comprises a third transistor comprising a third drain receiving the clock signal, a third gate coupled to the first source of the first transistor and a third source coupled to an output of the first shift register.

11. A gate driving method for a gate driver having a plurality of shift registers, comprising:
receiving a first frame and a second frame;
determining whether a first row of a pixel array needs to be scanned or skipped;
when it is determined that the first row is to be skipped, generating a first clock signal with a first voltage level and transmitting the first clock signal to a first shift register corresponding to the first row; and
when it is determined that the first row is to be scanned, generating a second clock signal with a second voltage level and transmitting the second clock signal to the first shift register, wherein the first voltage level is between the second voltage level and a third voltage level which maintains a previously written display data of the pixel array;
wherein at least one of the pixels coupled to the first row comprises a pixel transistor, and the first voltage level is set to not turn on the pixel transistor but have enough of a high voltage to maintain the propagation of the first shift register operation of the gate driver.

12. The gate driving method as claimed in claim 11, wherein the pixel transistor can be turned on by the second voltage level.

13. The gate driving method as claimed in claim 11, wherein the first shift register comprises a first transistor comprising a first drain coupled to an output of a previous shift register, a first gate coupled to the previous shift register, and a first source.

14. The gate driving method as claimed in claim 13, wherein the first shift register further comprises a second transistor comprising a second drain coupled to the first source of the first transistor, a second gate coupled to an output of a next shift register and a second source coupled to a ground voltage level.

15. The gate driving method as claimed in claim 14, wherein the first shift register further comprises a third transistor comprising a third drain receiving the clock signal, a third gate coupled to the first source of the first transistor and a third source coupled to an output of the first shift register.

* * * * *